United States Patent
Jiang et al.

(10) Patent No.: US 12,439,726 B2
(45) Date of Patent: Oct. 7, 2025

(54) SOLAR CELL AND MANUFACTURING METHOD THEREFOR

(71) Applicant: JA SOLAR TECHNOLOGY YANGZHOU CO., LTD., Yangzhou (CN)

(72) Inventors: Xiulin Jiang, Yangzhou (CN); Bin Chen, Yangzhou (CN); Wei Shan, Yangzhou (CN)

(73) Assignee: JA Solar Technology Yangzhou Co., LTD., Yangzhou (CN)

(*) Notice: Subject to any disclaimer, the term of this patent is extended or adjusted under 35 U.S.C. 154(b) by 0 days.

(21) Appl. No.: 18/703,157

(22) PCT Filed: Nov. 18, 2021

(86) PCT No.: PCT/CN2021/131385
§ 371 (c)(1),
(2) Date: Apr. 19, 2024

(87) PCT Pub. No.: WO2023/065448
PCT Pub. Date: Apr. 27, 2023

(65) Prior Publication Data
US 2025/0228035 A1 Jul. 10, 2025

(30) Foreign Application Priority Data
Oct. 20, 2021 (CN) .......................... 202111219711.4

(51) Int. Cl.
*H01L 31/044* (2014.01)
*H10F 71/00* (2025.01)
(Continued)

(52) U.S. Cl.
CPC ....... *H10F 77/215* (2025.01); *H10F 71/1221* (2025.01); *H10F 71/129* (2025.01);
(Continued)

(58) Field of Classification Search
CPC ........................................ H10F 71/00–1395
See application file for complete search history.

(56) References Cited

U.S. PATENT DOCUMENTS 9,716,204 B2  7/2017  Feldmann

FOREIGN PATENT DOCUMENTS

| CN | 101820009 A | 9/2010 |
| CN | 109671790 A | 4/2019 |

(Continued)

OTHER PUBLICATIONS

CN-111416011-A English (Year: 2020).*
(Continued)

*Primary Examiner* — Bach T Dinh
(74) *Attorney, Agent, or Firm* — Haynes and Boone, LLP

(57) ABSTRACT

The disclosure discloses a solar cell and a preparation method for a solar cell. The preparation method for a solar cell comprises: sequentially forming a tunnel silicon oxide layer, an N-type doped polysilicon layer, and a front metal layer in an entire fashion on a front surface of a P-type silicon substrate; subjecting the entire front metal layer to a photoetching process to form a patterned front fine gate electrode; subjecting the tunnel silicon oxide layer and the N-type doped polysilicon layer in a region not covered by the front fine gate electrode to chemical etching to form a local tunnel silicon oxide layer and a local N-type doped polysilicon layer, wherein the widths of the local tunnel silicon oxide layer and the local N-type doped polysilicon layer are the same as the width of the front fine gate electrode. The preparation method may achieve an automatic and precise alignment of the front fine gate electrode with a local tunnel oxide passivated layer and a local polysilicon layer, thereby effectively reducing a difficulty in a preparation process of a local passivated contact emitter while ensuring the efficiency of the solar cell.

9 Claims, 11 Drawing Sheets

(51) Int. Cl.
*H10F 77/164* (2025.01)
*H10F 77/20* (2025.01)
*H10F 77/30* (2025.01)
*H10F 77/70* (2025.01)

(52) U.S. Cl.
CPC ....... *H10F 77/1642* (2025.01); *H10F 77/315* (2025.01); *H10F 77/703* (2025.01)

(56) References Cited

FOREIGN PATENT DOCUMENTS

| | | | | | |
|---|---|---|---|---|---|
| CN | 110571299 | A | | 12/2019 | |
| CN | 111416011 | A | * | 7/2020 | ........... H01L 31/068 |
| CN | 111628050 | A | * | 9/2020 | ............. H10F 10/14 |
| CN | 111987188 | A | | 11/2020 | |
| CN | 112164728 | A | | 1/2021 | |
| CN | 112186049 | A | * | 1/2021 | ....... H01L 31/02167 |
| CN | 112885925 | A | | 6/2021 | |
| KR | 20100131203 | A | * | 12/2010 | |

OTHER PUBLICATIONS

KR-20100131203-A English (Year: 2010).*
CN-111628050-A English (Year: 2020).*
CN-112186049-A English (Year: 2021).*
Extended European Search Report dated Jan. 7, 2025 in related European Patent Application No. 21961187.8 (8 pages).

* cited by examiner

SOLAR CELL AND MANUFACTURING METHOD THEREFOR

CROSS-REFERENCE TO RELATED APPLICATION

This application is a national phase of PCT International Application No. PCT/CN/2021/131385, filed Nov. 18, 2021, which claims the benefit of and priority to CN202111219711.4, filed Oct. 20, 2021, the entire contents of each of which is hereby incorporated herein in its entirety by express reference thereto.

TECHNICAL FIELD

The disclosure relates to a solar cell and a preparation method for a solar cell.

BACKGROUND

A passivated contact structure composed of a tunnel silicon oxide layer and a doped polysilicon layer is used in TOPCon (Tunnel Oxide Passivated Contact) solar cell technology, which may effectively reduce surface recombination and metal contact recombination, and increase the cell conversion efficiency. However, when the aforesaid passivated contact structure is applied to the front surface of the solar cell, since the light absorption coefficient of the doped polysilicon layer is greater than that of the silicon substrate, the light on the front surface of the solar cell will be absorbed by this doped polysilicon layer, thereby significantly reducing the light absorption of the silicon substrate, and affecting the power generation efficiency of the solar cell.

Thus, in the prior art, the TOPCon solar cell technology is mostly used on the back surface of the solar cell, and when the TOPCon solar cell technology is applied to the front surface of the solar cell, a local passivated contact/emitter structure is usually used, that is, a passivated contact structure composed of a tunnel silicon oxide layer and a doped polysilicon layer is deposited only below a metal gate line region, but is not deposited in other regions to prevent the doped polysilicon layer from affecting the light absorption of the solar cell. At present, the local passivated contact/emitter structure is mainly prepared in a mask manner. First, a local passivated contact structure formed by a local tunnel silicon oxide layer and a local doped polysilicon layer is formed on the surface of the silicon substrate, and then a front metal electrode is prepared above the region of the local passivated contact structure by performing a secondary alignment with the local passivated contact structure by means of screen printing technology. During the preparation of the metal electrode, it is comparatively difficult to achieve a precise secondary alignment with the local passivated contact structure, which is not conducive to production. In order to facilitate the secondary alignment of the metal electrode with the local passivated contact structure during the preparation, a local passivated contact structure with a comparatively large width is usually formed first, but too wide a local passivated contact structure will result in a current loss to thereby limit the efficiency of the solar cell.

SUMMARY

In view of this, the technical problem to be solved by the disclosure lies in providing a solar cell and a preparation method for a solar cell, which may achieve an automatic and precise alignment of the front fine gate electrode with a local tunnel oxide passivated layer and a local polysilicon layer, thereby effectively reducing a difficulty in a preparation process of a local passivated contact emitter while ensuring the efficiency of the solar cell.

In order to achieve the aforesaid object, the disclosure provides the following technical solutions:

According to a first aspect, the disclosure provides a preparation method for a solar cell, comprising:

step 101: sequentially forming a tunnel silicon oxide layer, an N-type doped polysilicon layer, and a front metal layer in an entire fashion on a front surface of a P-type silicon substrate;

step 102: subjecting an entire front metal layer to a photoetching process to form a patterned front fine gate electrode;

step 103: subjecting the tunnel silicon oxide layer and the N-type doped polysilicon layer in a region not covered by the front fine gate electrode to chemical etching to form a local tunnel silicon oxide layer and a local N-type doped polysilicon layer, wherein the width of the local tunnel silicon oxide layer and the width the local N-type doped polysilicon layer are the same as the width of the front fine gate electrode.

Further, before the step 101, the method further comprises:

subjecting the front surface of the P-type silicon substrate to a texturing process.

Further, the step 101 comprises:

step 1-1: forming an entire tunnel silicon oxide layer on the front surface of the P-type silicon substrate;

step 1-2: forming an entire intrinsic polysilicon layer on the tunnel silicon oxide layer;

step 1-3: subjecting the intrinsic polysilicon layer to N-type doping to form an entire N-type doped polysilicon layer;

step 1-4: forming the entire front metal layer on the entire N-type doped polysilicon layer.

Further, the preparation method for a solar cell further comprises:

step 104: forming front passivated anti-reflection films on the front surface of the P-type silicon substrate and the front surface of the front fine gate electrode;

step 105: printing a front main gate electrode on the front surface of the front passivated anti-reflection film, and after sintering, connecting the front main gate electrode to the front fine gate electrode through the front passivated anti-reflection film.

Further, the step 102 comprises:

step 2-1: forming a photoresist layer on the front metal layer;

step 2-2: subjecting the photoresist layer to an exposing process by means of a mask, the photoresist layer in an exposed region forming an exposed photoresist layer, and the photoresist layer in an unexposed region being removed using a first solution to expose the front metal layer;

step 2-3: removing the exposed front metal layer using a second solution, the front metal layer covered by the exposed photoresist layer forming the front fine gate electrode;

step 2-4: removing the exposed photoresist layer using a film stripping solution.

According to a second aspect, the disclosure provides a further preparation method for a solar cell, comprising:

step 201: sequentially forming a tunnel silicon oxide layer and an intrinsic polysilicon layer in an entire fashion on a front surface and a back surface of a P-type silicon substrate, respectively;

step 202: subjecting the intrinsic polysilicon layer on the front surface to N-type doping to form an entire N-type doped polysilicon layer;

step 203: forming an entire front metal layer on the N-type doped polysilicon layer;

step 204: subjecting the entire front metal layer to a photoetching process to form a patterned front fine gate electrode;

step 205: subjecting the tunnel silicon oxide layer and the N-type doped polysilicon layer in a region not covered by the front fine gate electrode on the front surface and the tunnel silicon oxide layer and the intrinsic polysilicon layer on the back surface to chemical etching to form a local tunnel silicon oxide layer and a local N-type doped polysilicon layer on the front surface, and to remove the tunnel silicon oxide layer and the intrinsic polysilicon layer on the back surface.

Further, before, the step 201, the preparation method for a solar cell further comprises:

subjecting the front surface and the back surface of the P-type silicon substrate to a texturing process, respectively, and then subjecting the back surface to a polishing process.

Further, the method further comprises:

step 206: forming front passivated anti-reflection films on the front surface of the P-type silicon substrate and the front surface of the front fine gate electrode, and forming a back passivated anti-reflection film on the back surface of the P-type silicon substrate;

step 207: performing grooving on the back passivated anti-reflection film, and forming a back fine gate electrode in a grooved region;

step 208: printing a front main gate electrode on the front surface of the front passivated anti-reflection film, printing back main gate electrodes on the back surfaces of the back passivated anti-reflection film and the back fine gate electrode, and by means of a sintering process, forming a P-type doped silicon layer in the grooved region, and the front main gate electrode being connected to the front fine gate electrode through the front passivated anti-reflection film, the back main gate electrode being electrically connected to the back fine gate electrode, and the back fine gate electrode being in an ohmic contact with the P-type doped silicon layer.

Further, the step 204 comprises:

step 4-1: forming a photoresist layer on the front metal layer;

step 4-2: subjecting the photoresist layer to an exposing process by means of a mask, the photoresist layer in an exposed region forming an exposed photoresist layer, and the photoresist layer in an unexposed region being removed using a first solution to expose the front metal layer;

step 4-3: removing the exposed front metal layer using a second solution, the front metal layer covered by the exposed photoresist layer forming the front fine gate electrode;

step 4-4: removing the exposed photoresist layer using a film stripping solution.

According to a third aspect, the embodiment of the disclosure provides a solar cell, which is prepared by the preparation method provided according to the aforesaid first aspect or second aspect.

The technical solutions disclosed above have the following advantages or beneficial effects: the solution provided by the embodiment of the disclosure sequentially forms a tunnel silicon oxide layer, an N-type doped polysilicon layer, and a front metal layer in an entire fashion on a front surface of a P-type silicon substrate; then subjects an entire front metal layer to a photoetching process to form a patterned front fine gate electrode; subjects the tunnel silicon oxide layer and the N-type doped polysilicon layer in a region not covered by the front fine gate electrode to chemical etching to form a local tunnel silicon oxide layer and a local N-type doped polysilicon layer, wherein the width of the local tunnel silicon oxide layer and the width the local N-type doped polysilicon layer are the same as the width of the front fine gate electrode, thereby achieving an automatic and precise alignment of the front fine gate electrode with a local tunnel oxide passivated layer and a local polysilicon layer during preparation of a metal electrode, and effectively reducing a difficulty in a preparation process of a local passivated contact emitter while ensuring the efficiency of the solar cell.

REFERENCE SIGNS ARE AS FOLLOWS

1—P-type silicon substrate; 2—tunnel silicon oxide layer; 3—intrinsic polysilicon layer; 4—N-type doped polysilicon layer; 5—front metal layer; 5a—front fine gate electrode; 5b—front main gate electrode; 6—photoresist layer; 7—exposed photoresist layer; 8—front passivated anti-reflection film; 9—back passivated anti-reflection film; 10a—back fine gate electrode; 10b—back main gate electrode; 11—P-type doped silicon layer.

DETAILED DESCRIPTION

In the descriptions below and the enclosed claims, an ohmic connection refers to a contact between a metal and a semiconductor, and the resistance value of the contact surface is much smaller than the resistance of the semiconductor itself, so that when a component is operated, most of the voltages drop in the active area rather than at the contact surface. In the present application, the ohmic contact may refer to the ohmic contact between the front fine gate electrode and the front N-type doped polysilicon layer or the ohmic contact between the back fine gate electrode and the back P-type doped silicon layer.

As mentioned above, when the TOPCon solar cell technology is applied to the front surface of the solar cell by means of a local passivated contact/emitter structure, there are problems such as a difficulty in a secondary alignment or an impact of too wide a local passivated contact structure on the cell efficiency.

Figure 1:
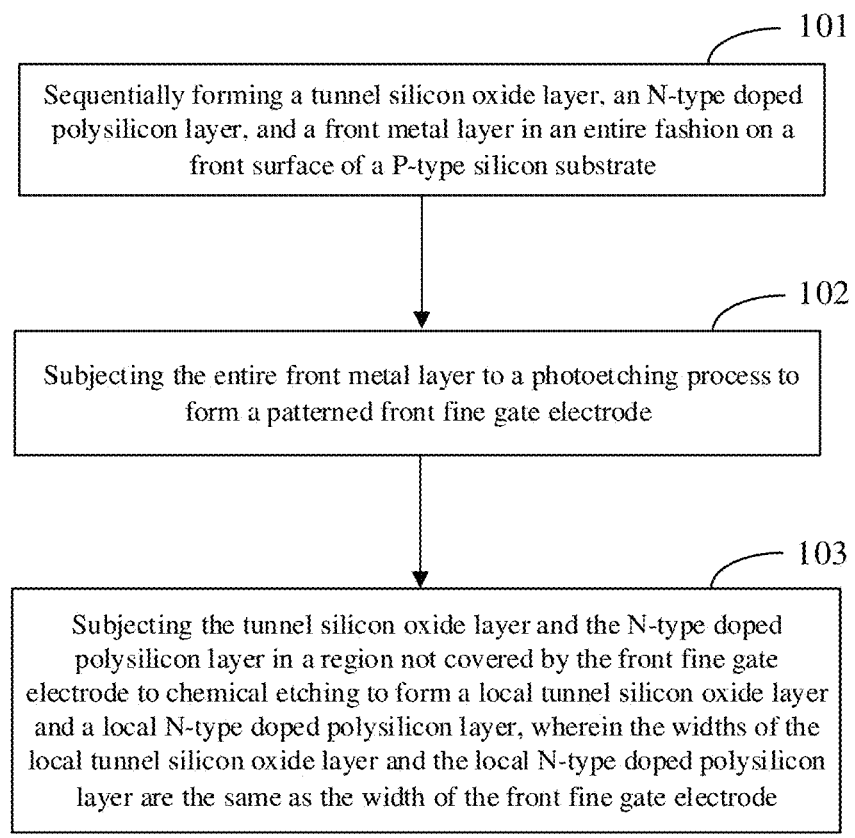
FIG. 1 is a schematic diagram of a flow of a preparation method for a solar cell according to the disclosure.

In order to solve the above problems, the embodiment of the disclosure provides a preparation method for a solar cell. FIG. 1 is a schematic diagram of a main flow of a preparation method for a solar cell. As shown in FIG. 1, the preparation method for a solar cell comprises the following steps:

step 101: sequentially forming a tunnel silicon oxide layer 2, an N-type doped polysilicon layer 4, and a front metal layer 5 in an entire fashion on a front surface of a P-type silicon substrate 1;

step 102: subjecting an entire front metal layer 5 to a photoetching process to form a patterned front fine gate electrode 5a;

step 103: subjecting the tunnel silicon oxide layer 2 and the N-type doped polysilicon layer 4 in a region not covered by the front fine gate electrode 5a to chemical etching to form a local tunnel silicon oxide layer 2 and a local N-type doped polysilicon layer 4, wherein the width of the local tunnel silicon oxide layer 2 and the width the local N-type doped polysilicon layer 4 are the same as the width of the front fine gate electrode 5a.

wherein, the front surface of the P-type silicon substrate 1 refers to the surface of the P-type silicon substrate facing towards the sunlight after the P-type silicon substrate is used to manufacture a solar cell, that is, the light-receiving surface of the P-type silicon substrate that receives sunlight. On the contrary, the back surface of the P-type silicon substrate 1 refers to the surface facing away from the sunlight, that is, the backlit surface opposite to the light-receiving surface of the P-type silicon substrate 1.

Figure 2:
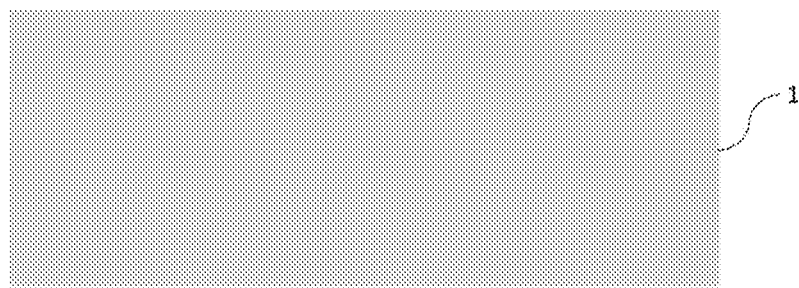
FIG. 2 shows a schematic diagram of a structure before subjecting a P-type silicon substrate to a texturing process according to the disclosure.
Figure 3:
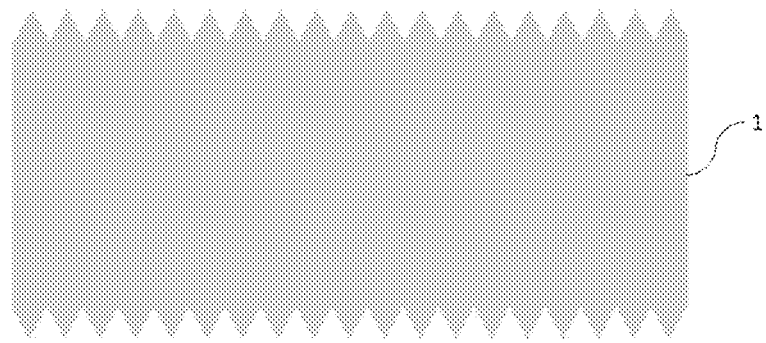
FIG. 3 shows a schematic diagram of a structure after subjecting the P-type silicon substrate to the texturing process on the front surface and the back surface, respectively according to the disclosure.
Figure 4:
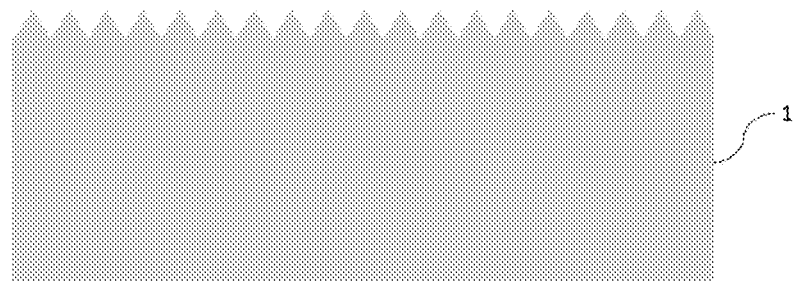
FIG. 4 shows a schematic diagram of a structure after subjecting the P-type silicon substrate to a polishing process on the back surface according to the disclosure.

Before the step 101, the specific implementation scheme may further comprise:

subjecting the front surface of the P-type silicon substrate 1 to a texturing process. Specifically, a pyramid-like structure or a honeycomb-like structure is formed on the front surface of the P-type silicon substrate 1 after the texturing process. In the treatment of the solar cell surfaces, texturing is a process in which the surface of the silicon substrate is pre-cleaned and corroded with a strong alkaline or a strong acid to form a pyramid-like or honeycomb-like structure. The texturing may not only serve the purpose of reducing the reflectivity of the surface and removing the damaged layer, but also serve the purpose of forming a light trap (an anti-reflection texture) inside the cell. The effective length of the light movement inside the silicon substrate is increased, and the absorption of light by the silicon substrate is facilitated, thereby the conversion efficiency of the solar cells is increased by using the light trapping principle. And FIG. 2 shows a schematic diagram of a structure before subjecting a P-type silicon substrate to a texturing process according to the disclosure. In an optional embodiment, while the front surface of the P-type silicon substrate 1 is subjected to the texturing process, the back surface of the P-type silicon substrate 1 may also be subjected to the texturing process, wherein FIG. 3 shows a schematic diagram of a structure after subjecting the P-type silicon substrate to the texturing process on the front surface and the back surface, respectively according to the disclosure. Further, after the back surface of the P-type silicon substrate 1 is subjected to the texturing process, the back surface of the P-type silicon substrate 1 is subjected to a polishing process. The polishing process is just to subject the pyramid-like structure or honeycomb-like structure formed after the back surface of the P-type silicon substrate 1 is subjected to the texturing process to a smoothing process, to promote the passivation of the crystalline silicon surface on the back surface of the P-type silicon substrate 1 to thereby increase the cell efficiency. Wherein FIG. 4 shows a schematic diagram of a structure after subjecting the P-type silicon substrate to a polishing process on the back surface according to the disclosure.

Figure 5:
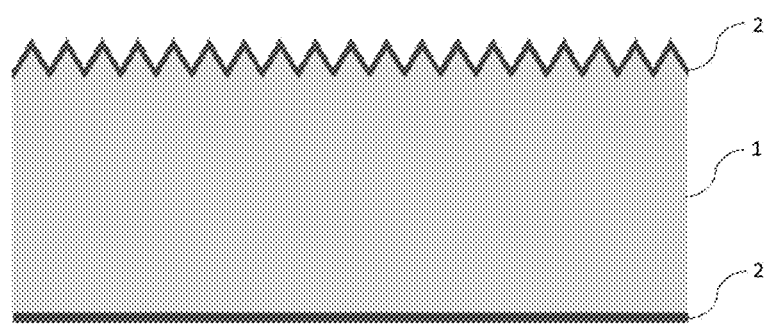
FIG. 5 shows a schematic diagram of a structure after forming a tunnel silicon oxide layer on the P-type silicon substrate according to the disclosure.
Figure 6:
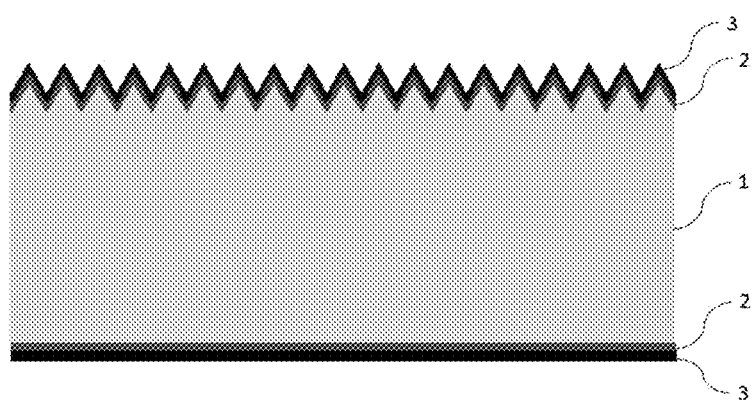
FIG. 6 shows a schematic diagram of a structure after forming an intrinsic polysilicon layer on the tunnel silicon oxide layer according to the disclosure.
Figure 7:
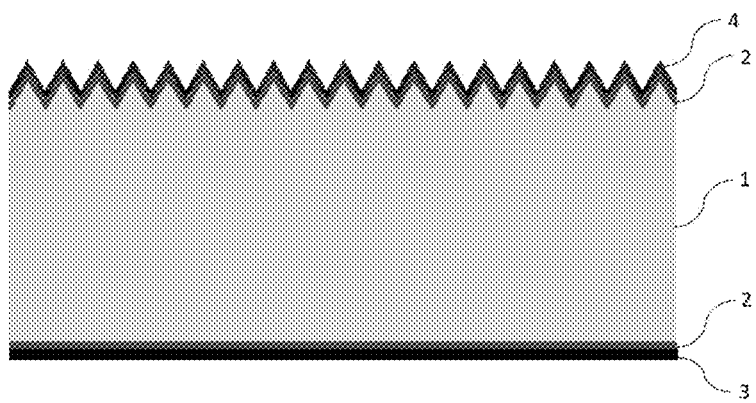
FIG. 7 shows a schematic diagram of a structure after subjecting the intrinsic polysilicon layer to doping to form an N-type doped polysilicon layer according to the disclosure.
Figure 8:
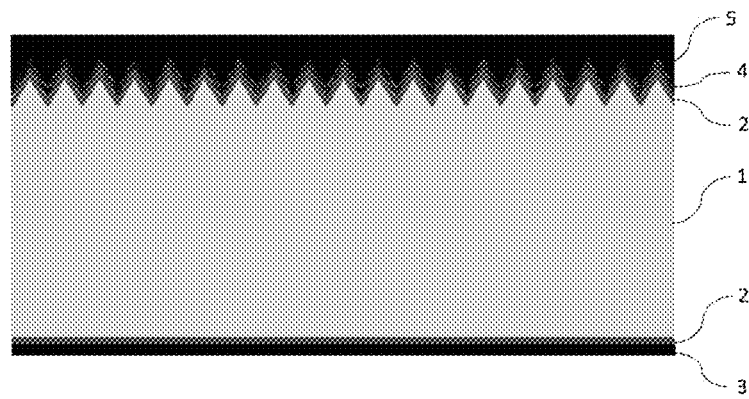
FIG. 8 shows a schematic diagram of a structure after forming a front metal layer on the N-type doped polysilicon layer according to the disclosure.

With respect to the aforesaid step 101, the specific implantation scheme may comprise:

step 1-1: forming an entire tunnel silicon oxide layer 2 on the front surface of the P-type silicon substrate 1. Wherein the thickness of the tunnel silicon oxide layer 2 is an arbitrary value in a range of 0.5-2 nm, such as 0.5 nm, 0.8 nm, 1.0 nm, 1.2 nm, 1.5 nm, 1.8 nm, and 2.0 nm. Based on the quantum tunneling effect, since the tunnel silicon oxide layer with this thickness is comparatively thin, carriers in the silicon substrate may pass through this layer and be collected. In an optional embodiment, the width of the tunnel silicon oxide layer 2 is an arbitrary value in a range of 5-30 μm. In one embodiment, the tunnel silicon oxide layer 2 may be formed by a high-temperature thermal oxidation method, a nitric acid oxidation method, an ozone oxidation method, or a CVD (Chemical Vapor Deposition) method. In an optional embodiment, the entire tunnel silicon oxide layer 2 is also synchronously formed on the back surface of the P-type silicon substrate 1, wherein FIG. 5 shows a schematic diagram of a structure after forming a tunnel silicon oxide layer on the P-type silicon substrate according to the disclosure.

step 1-2: forming an entire intrinsic polysilicon layer 3 on the tunnel silicon oxide layer 2. FIG. 6 shows a schematic diagram of a structure after forming an intrinsic polysilicon layer 3 on the tunnel silicon oxide layer according to the disclosure. Specifically, the intrinsic polysilicon layer 3 may be formed by LPCVD (Low Pressure Chemical Vapor Deposition) or PVD (Physical Vapor Deposition). In an optical embodiment, the entire intrinsic polysilicon layer 3 is also synchronously formed on the back surface of the P-type silicon substrate 1, and forming the entire tunnel silicon oxide layer 2 and the entire intrinsic polysilicon layer 3 on the back surface of the back surface of the P-type silicon substrate 1 facilitates that in the subsequent process of forming a metal electrode layer and a photoresist layer, subjecting the photoresist layer 6 to an exposing process by means of a mask, and removing the unexposed photoresist layer 6 and the front metal layer 5 covered by the unexposed photoresist layer 6 in a chemical etching manner to form the front fine gate electrode 5a, the silicon substrate surface on the back surface of the P-type silicon substrate 1 is well protected by the intrinsic polysilicon layer 3, which may effectively reduce the damage and contamination in the process of manufacturing the silicon substrate.

step 1-3: subjecting the intrinsic polysilicon layer 3 to N-type doping to form an entire N-type doped polysilicon layer 4. Specifically, the intrinsic polysilicon layer 3 may be subjected to an N-type doping process in an ion implantation manner to form the entire N-type doped polysilicon layer 4. The N-type doping includes, for example, phosphorus doping. In one embodiment, the thickness of the N-type doped polysilicon layer 4 may be 5 nm-200 nm. The passivated contact structure composed of the tunnel silicon oxide layer 2 and the N-type doped polysilicon layer 4 may effectively reduce surface recombination and metal contact recombination, and increase the cell conversion efficiency while ensuring the passage of carriers. Wherein, FIG. 7 shows a schematic diagram of a structure after subjecting the intrinsic polysilicon layer 3 to N-doping to form an N-type doped polysilicon layer 4 according to the disclosure.

step 1-4: forming the entire front metal layer 5 on the entire N-type doped polysilicon layer 4. In one embodiment, the PVD (Physical Vapor Deposition) technology may be used to form the front metal layer 5 on the N-type doped polysilicon layer 4, or a method of combining the PVD with an electroplating method or a light-induced deposition method may be used to form the front metal layer 5, which is made of a copper metal. In one embodiment, the PVD technology is used to directly form an entire metal electrode layer 5 made of a copper material on the entire N-type doped polysilicon layer 4 by means of a physical deposition method. In an optional embodiment, after a seed layer is formed on the entire N-type doped polysilicon layer 4 by means of the PVD technology (specifically, after ionizing copper, a seed layer is generated on the N-type doped polysilicon layer 4 by means of physical vapor deposition), the P-type silicon substrate 1 having its front surface formed with the tunnel silicon oxide layer 2 and the N-type doped polysilicon layer 4 is immersed into an electroplating solution to form the front metal layer 5. In a further optional embodiment, after the seed layer is formed on the entire N-type doped polysilicon layer 4 by means of the PVD technology, a laser is used as an induced light source to deposit a copper material on the entire N-type doped polysilicon layer 4 to form the front metal layer 5. Wherein, the PVD is used to form the seed layer before the electroplating or light-induced deposition is performed, which facilitates increase of a bonding force of the deposited metal, thereby increasing the efficiency of the electroplating or light-induced deposition. Meanwhile, as for the front fine gate electrode made of the copper metal, on the one hand, the copper metal may directly contact the passivated contact structure, and it is not required to burn through a glass frit in a silver paste to achieve a contact with the passivated contact structure, thereby reducing the resistance of the cell that is series connected and increasing the fill factor of the cell and the efficiency of the solar cell. Wherein FIG. 8 shows a schematic diagram of a structure after forming a front metal layer 5 on the N-type doped polysilicon layer 4 according to the disclosure.

With respect to the aforesaid step 102, the specific implementation scheme may comprise:

step 2-1: forming a photoresist layer 6 on the front metal layer 5;

step 2-2: subjecting the photoresist layer 6 to an exposing process by means of a mask, the photoresist layer 6 in an exposed region forming an exposed photoresist layer 7, and the photoresist layer 6 in an unexposed region being removed using a first solution to expose the front metal layer 5;

step 2-3: removing the exposed front metal layer 5 using a second solution, the front metal layer 5 covered by the exposed photoresist layer 7 forming the front fine gate electrode 5a;

step 2-4: removing the exposed photoresist layer 7 using a film stripping solution.

Figure 9:
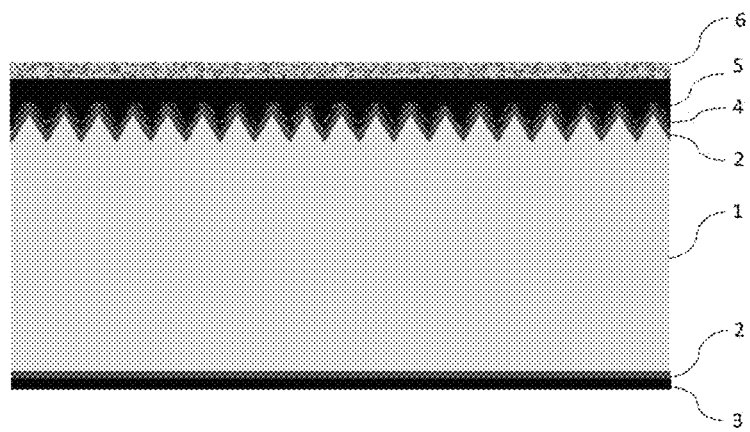
FIG. 9 shows a schematic diagram of a structure after forming a photoresist layer on the front metal layer according to the disclosure.

Specifically, in the step 2-1, an entire photoresist layer 6 is formed on the entire front metal layer 5 in an attachment manner. FIG. 9 shows a schematic diagram of a structure after forming a photoresist layer on the front metal layer according to the disclosure.

Figure 10:
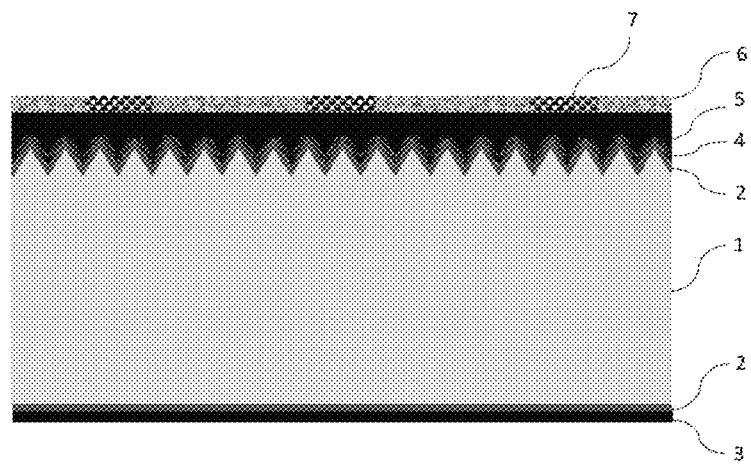
FIG. 10 shows a schematic diagram of a structure after subjecting the photoresist layer to an exposing process by means of a mask.

With respect to the aforesaid step 2-2 to the aforesaid step 2-4, the specific implementation scheme may comprise:

First, the photoresist layer 6 is subjected to the exposing process by means of a mask; wherein the shape of the mask is the same as the shape of the subsequently formed patterned front fine gate electrode 5a. By covering the mask on the photoresist layer 6, and then performing an exposing process, the photoresist layer 6 is divided into an exposed region and an unexposed region, wherein the photoresist layer 6 in the exposed region is exposed to form an exposed photoresist layer 7, which corresponds to the patterned front fine gate electrode 5a to be formed, and the unexposed photoresist layer 6 can be removed using the first solution to thereby expose the front metal layer 5. FIG. 10 shows a schematic diagram of a structure after subjecting the photoresist layer 6 to an exposing process by means of a mask, wherein the reference sign 7 represents the exposed photoresist layer.

Figure 11:
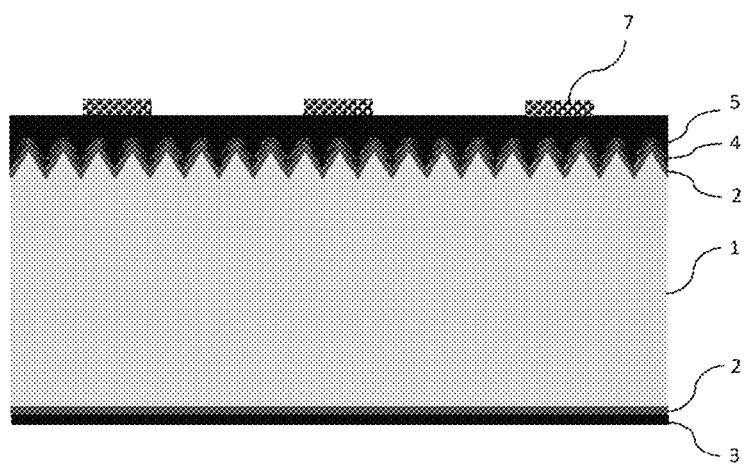
FIG. 11 shows a schematic diagram of a structure after removing an unexposed photoresist layer.

The first solution is a sodium carbonate solution or a potassium carbonate solution, and then the first solution is used to remove the unexposed photoresist layer 6 while leaving the exposed photoresist layer 7. FIG. 11 shows a schematic diagram of a structure after removing an unexposed photoresist layer.

Figure 12:
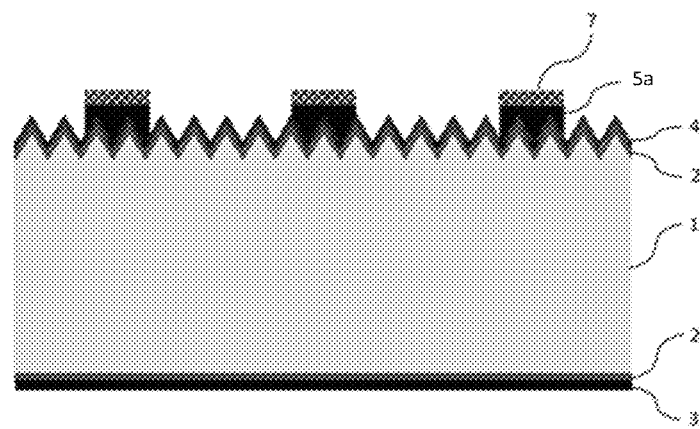
FIG. 12 shows a schematic diagram of a structure after removing the front metal layer covered by the unexposed photoresist layer.
Figure 23:
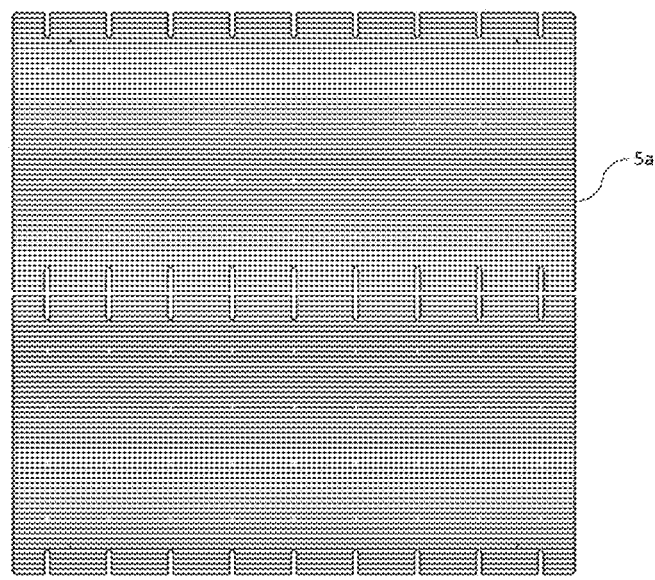
FIG. 23 shows a pattern of the front fine gate electrode.

Then, the exposed front metal layer 5 is etched using a second solution, which is a mixture of a sulfuric acid and hydrogen peroxide. After the front metal layer 5 covered by the unexposed photoresist layer 6 is removed using the second solution, the left front metal layer 5 covered and protected by the exposed photoresist layer 7 forms the front fine gate electrode 5a, which has its gate line width of 2-30 μm. By means of the aforesaid process, it is only subsequently required to further remove the N-type doped polysilicon layer 4 and the tunnel silicon oxide layer 2 not covered by the front fine gate electrode 5a to form a local tunnel silicon oxide layer 2 and a local N-type doped polysilicon layer 4, the widths of which are the same as the width of the front fine gate electrode 5a, that is, this process may avoid the requirement for a process of a secondary alignment of the front fine gate electrode 5a with the local tunnel silicon oxide layer 2 and the local N-type doped polysilicon layer 4 by means of screen printing in the prior art, and this process reduces a difficulty in a preparation process while ensuring the efficiency of the solar cell. FIG. 23 shows a pattern of the front fine gate electrode 5a. FIG. 12 shows a schematic diagram of a structure after removing the front metal layer covered by the unexposed photoresist layer 6.

Figure 13:
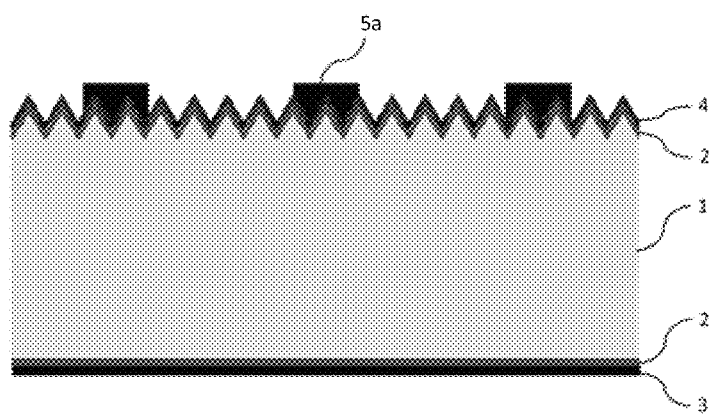
FIG. 13 shows a schematic diagram of a structure after removing an exposed photoresist layer.

Finally, the film stripping solution may be used to react with the exposed photoresist 7 to remove the exposed photoresist layer 7 on the front fine gate electrode 5a to form the patterned front fine gate electrode 5a, wherein the film stripping solution is a potassium hydroxide or sodium hydroxide solution. FIG. 13 shows a schematic diagram of a structure after removing an exposed photoresist layer.

Figure 14:
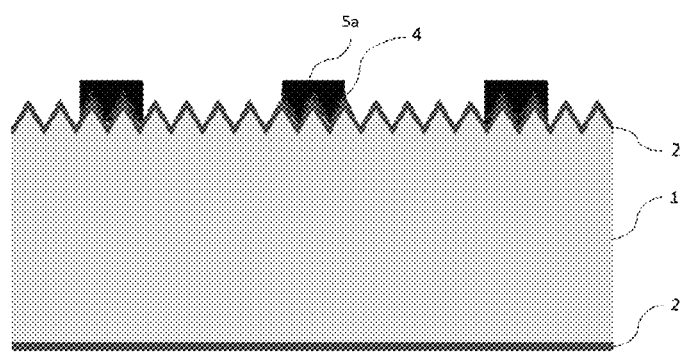
FIG. 14 shows a schematic diagram of a structure after removing the N-type doped polysilicon layer in a region not covered by a front fine gate electrode and the intrinsic polysilicon layer on the back surface.

With respect to the aforesaid step 103, the specific implementation scheme may comprise:

First, the N-type doped polysilicon layer 4 in the region not covered by the front fine gate electrode 5a is removed using an alkali solution. The alkali solution is generally a KOH solution, a NaOH solution, and so on, and the concentration and action time thereof may be adjusted according to actual requirements. For example, the KOH solution may be selected, wherein the volume ratio of KOH to deionized water is 3:11. In an optional embodiment, after the tunnel silicon oxide layer 2 and the intrinsic polysilicon layer 3 are also formed on the back surface of the silicon substrate, the intrinsic polysilicon layer 3 on the back surface may be removed while the N-type doped polysilicon layer 4 in the region not covered by the front fine gate electrode 5a is removed. FIG. 14 shows a schematic diagram of a structure after removing the N-type doped polysilicon layer 4 in a region not covered by a front fine gate electrode 5a and the intrinsic polysilicon layer 3 on the back surface.

Figure 15:
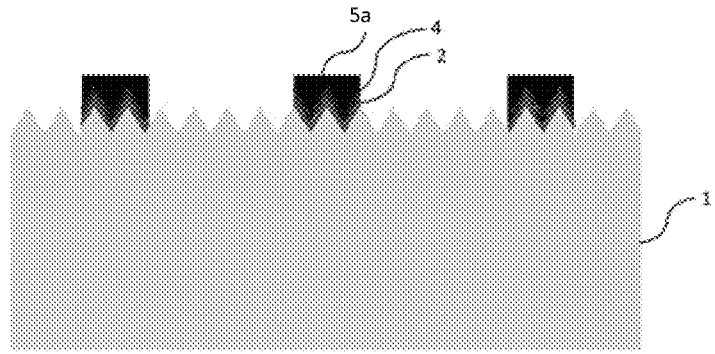
FIG. 15 shows a schematic diagram of a structure after removing the tunnel silicon oxide layer in the region not covered by the front fine gate electrode and the tunnel silicon oxide layer on the back surface.

Then, the tunnel silicon oxide layer 2 in the region not covered by the front fine gate electrode 5a is removed using an acid solution. Wherein the acid solution is generally an HF solution, and the concentration and corrosion time of the HF solution may be adjusted according to actual requirements. For example, the volume ratio of HF to deionized water in the HF solution is 2:3. In an optional embodiment, in a case where the tunnel silicon oxide layer 2 is also formed on the back surface of the silicon substrate, the tunnel silicon oxide layer 2 on the back surface is removed while the tunnel silicon oxide layer 2 on the front surface is removed. FIG. 15 shows a schematic diagram of a structure after removing the tunnel silicon oxide layer 2 in the region not covered by the front fine gate electrode and the tunnel silicon oxide layer 2 on the back surface.

Figure 16:
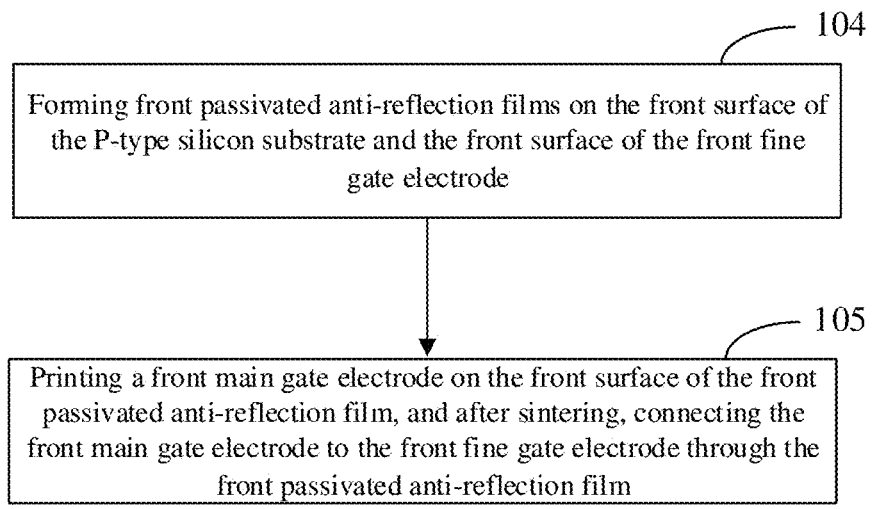
FIG. 16 shows a schematic diagram of a flow of forming a front passivated anti-reflection film and a front main gate electrode on the front fine gate electrode on the front surface of the P-type silicon substrate.
Figure 17:
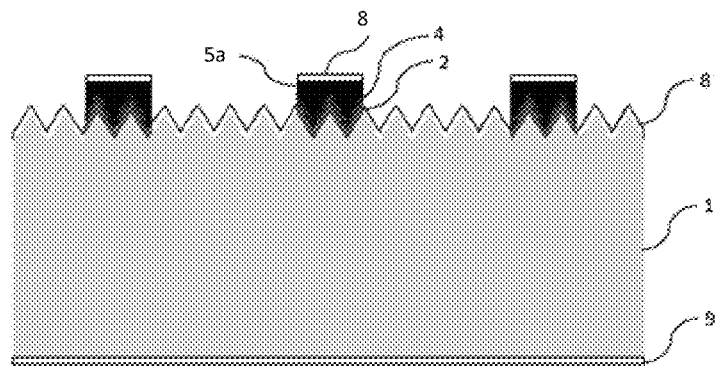
FIG. 17 shows a schematic diagram of a structure after forming the front passivated anti-reflection film on the front surface of the P-type silicon substrate and forming a back passivated anti-reflection film on the back surface.
Figure 24:
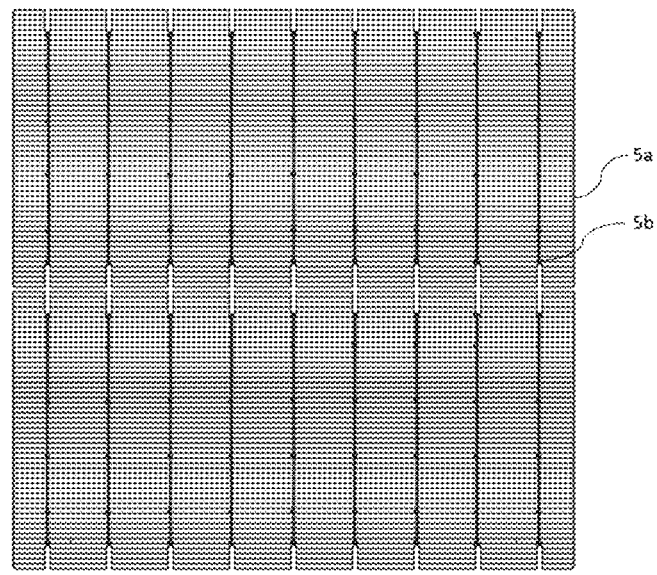
FIG. 24 shows patterns of the front fine gate electrode and the front main gate electrode.

According to the embodiment of the disclosure, as shown in FIG. 16, the preparation method for a solar cell may further comprise the following steps:

step 104: forming front passivated anti-reflection films 8 on the front surface of the P-type silicon substrate 1 and the front surface of the front fine gate electrode 5a;

step 105: printing a front main gate electrode 5b on the front surface of the front passivated anti-reflection film 8, and after sintering, connecting the front main gate electrode 5b to the front fine gate electrode 5a through the front passivated anti-reflection film 8. FIG. 24 shows patterns of the front fine gate electrode and the front main gate electrode;

With the step 104, the specific implementation scheme may comprise:

The front passivated anti-reflection films 8 are formed on the front surface of the P-type silicon substrate 1 and the front surface of the front fine gate electrode 5a. In an optional embodiment, a back passivated anti-reflection film 9 is formed on the back surface of the P-type silicon substrate 1, wherein the front passivated anti-reflection film 8 and the back passivated anti-reflection film 9 are both made of at least one of aluminum oxide, silicon oxide, gallium oxide, silicon nitride, aluminum nitride, and silicon oxynitride. FIG. 17 shows a schematic diagram of a structure after forming the front passivated anti-reflection film on the front surface of the P-type silicon substrate and forming a back passivated anti-reflection film on the back surface.

Figure 18:
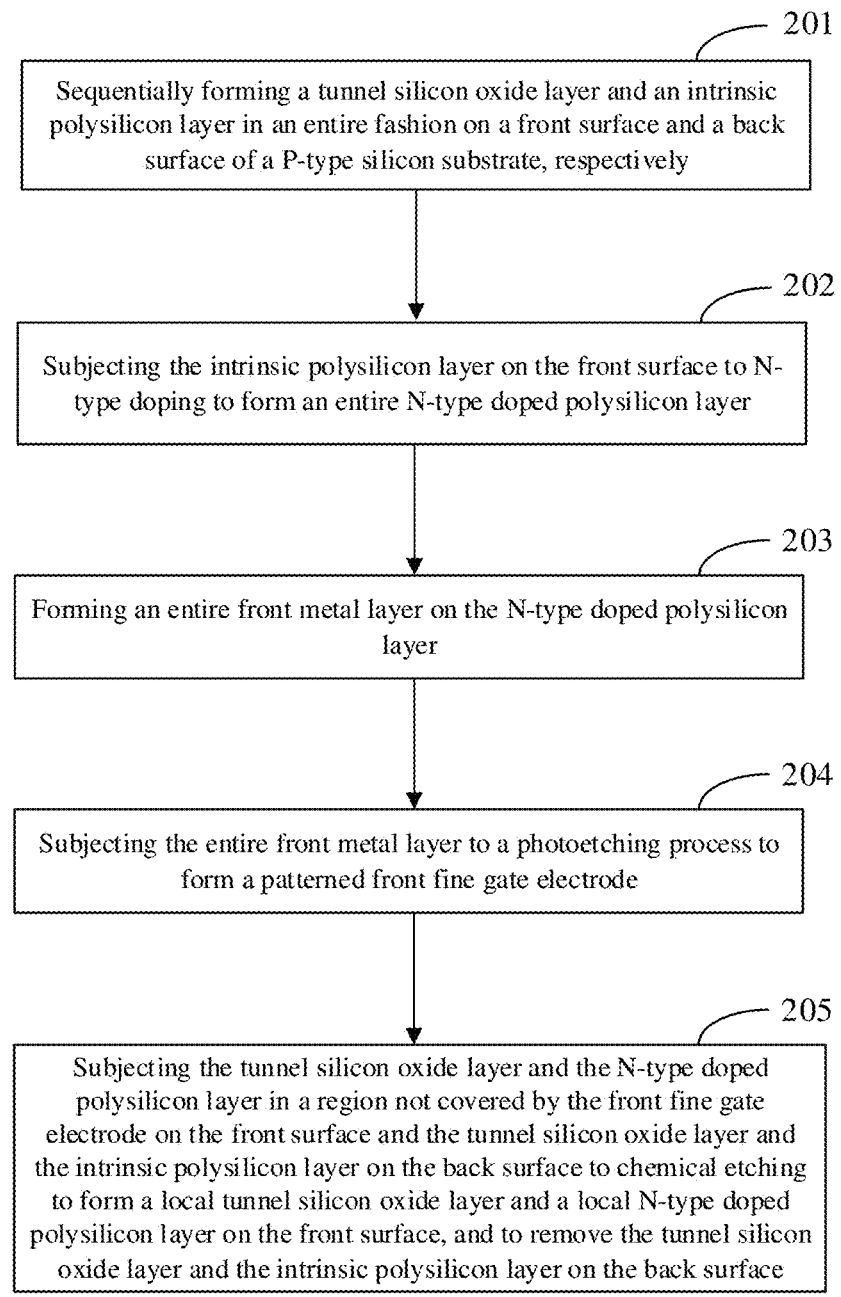
FIG. 18 is a schematic diagram of a flow of another preparation method for a solar cell according to the disclosure.

The embodiment of the disclosure further provides a preparation method for a solar cell. As shown in FIG. 18, the preparation method for a solar cell may comprise the following steps:

step 201: sequentially forming a tunnel silicon oxide layer 2 and an intrinsic polysilicon layer 3 in an entire fashion on a front surface and a back surface of a P-type silicon substrate 1, respectively;

step 202: subjecting the intrinsic polysilicon layer 3 on the front surface to N-type doping to form an entire N-type doped polysilicon layer 4;

step 203: forming an entire front metal layer 5 on the N-type doped polysilicon layer 4;

step 204: subjecting the entire front metal layer 5 to a photoetching process to form a patterned front fine gate electrode 5a;

step 205: subjecting the tunnel silicon oxide layer 2 and the N-type doped polysilicon layer 4 in a region not covered by the front fine gate electrode 5a on the front surface and the tunnel silicon oxide layer 2 and the intrinsic polysilicon layer 3 on the back surface to chemical etching to form a local tunnel silicon oxide layer 2 and a local N-type doped polysilicon layer 4 on the front surface, and to remove the tunnel silicon oxide layer 2 and the intrinsic polysilicon layer 3 on the back surface.

Before the step 201, the specific implementation scheme may also comprise:

subjecting the front surface and the back surface of the P-type silicon substrate 1 to a texturing process, respectively, and then subjecting the back surface to a polishing process. Wherein, FIG. 3 shows a schematic diagram of a structure after subjecting the P-type silicon substrate to the texturing process on the front surface and the back surface, respectively according to the disclosure.

With respect to the aforesaid step 204, the specific implementation scheme may also comprise:

step 4-1: forming a photoresist layer 6 on the front metal layer 5;

step 4-2: subjecting the photoresist layer 6 to an exposing process by means of a mask, the photoresist layer 6 in an exposed region forming an exposed photoresist layer 7, and the photoresist layer 6 in an unexposed region being removed using a first solution to expose the front metal layer 5;

step 4-3: removing the exposed front metal layer 5 using a second solution, the front metal layer 5 covered by the exposed photoresist layer 7 forming the front fine gate electrode 5a;

step 4-4: removing the exposed photoresist layer 7 using a film stripping solution.

Specifically, first, an entire photoresist layer 6 is formed on the entire front metal layer 5 in an attachment manner. FIG. 9 shows a schematic diagram of a structure after forming a photoresist layer on the front metal layer according to the disclosure. In the process of subjecting the photoresist layer 6 to an exposing process by means of a mask, the shape of the mask is the same as the shape of the subsequently formed patterned front fine gate electrode 5a. By covering the mask on the photoresist layer 6, and then performing an exposing process, the photoresist layer 6 is divided into an exposed region and an unexposed region, wherein the photoresist layer 6 in the exposed region is exposed to form an exposed photoresist layer 7, which corresponds to the patterned front fine gate electrode 5a to be formed, and the unexposed photoresist layer 6 may be removed using the first solution to thereby expose the front metal layer 5. FIG. 10 shows a schematic diagram of a structure after subjecting the photoresist layer 6 to an exposing process by means of a mask, wherein the reference sign 7 represents the exposed photoresist layer.

Wherein, the first solution is a sodium carbonate solution or a potassium carbonate solution, and then the first solution is used to remove the unexposed photoresist layer 6 while leaving the exposed photoresist layer 7. FIG. 11 shows a schematic diagram of a structure after removing an unexposed photoresist layer.

Then, the exposed front metal layer 5 is etched using a second solution, which is a mixture of a sulfuric acid and hydrogen peroxide. After the front metal layer 5 covered by the unexposed photoresist layer 6 is removed using the second solution, the left front metal layer 5 covered and protected by the exposed photoresist layer 7 forms the front fine gate electrode 5a, which has its gate line width of 2-30 μm. By means of the aforesaid process, it is only subsequently required to further remove the N-type doped polysilicon layer 4 and the tunnel silicon oxide layer 2 not covered by the front fine gate electrode 5a to form a local tunnel silicon oxide layer 2 and a local N-type doped polysilicon layer 4, the widths of which are the same as the width of the front fine gate electrode 5a, that is, this process may avoid the requirement for a process of a secondary alignment of the front fine gate electrode 5a with the local tunnel silicon oxide layer 2 and the local N-type doped polysilicon layer 4 by means of screen printing in the prior art, and this process reduces a difficulty in a preparation process while ensuring the efficiency of the solar cell. FIG. 23 shows a pattern of the front fine gate electrode 5a. FIG. 12 shows a schematic diagram of a structure after removing the front metal layer covered by the unexposed photoresist layer 6.

Finally, the film stripping solution may be used to react with the exposed photoresist 7 to remove the exposed photoresist 7 on the front fine gate electrode 5a to form the patterned front fine gate electrode 5a, wherein the film stripping solution is a potassium hydroxide or sodium hydroxide solution. FIG. 13 shows a schematic diagram of a structure after removing an exposed photoresist layer.

Figure 19:
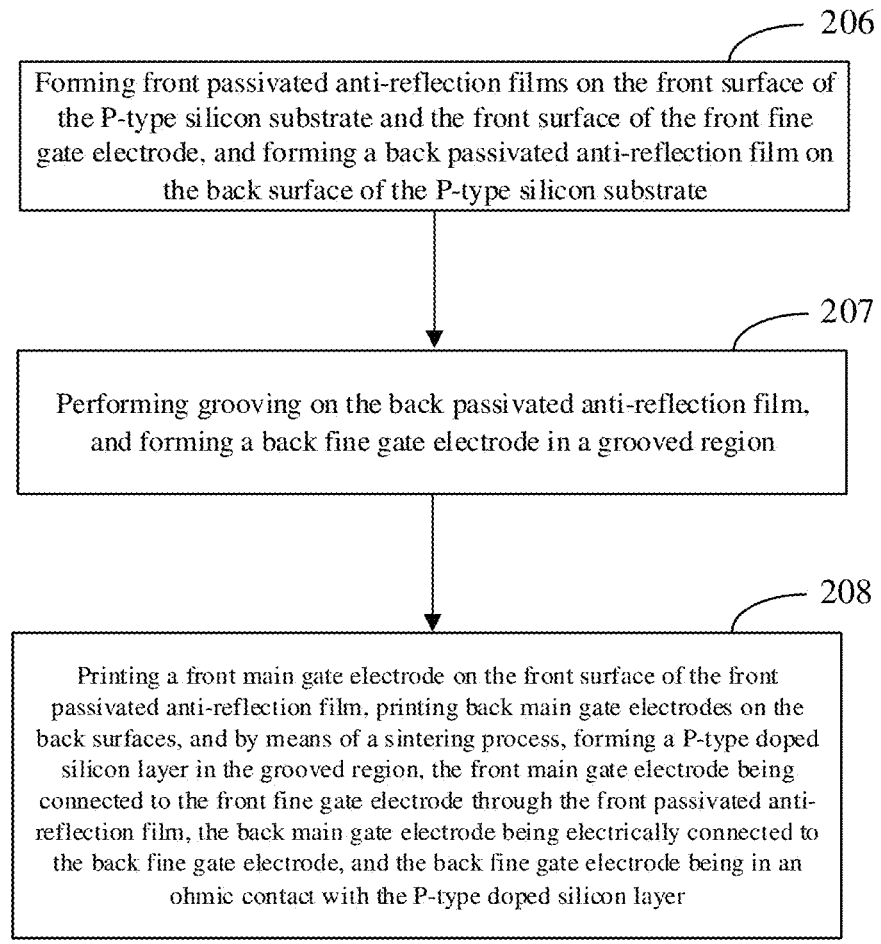
FIG. 19 shows a schematic diagram of a flow of preparing the front main gate electrode on the front surface and preparing a back metal electrode on the back surface.
Figure 20:
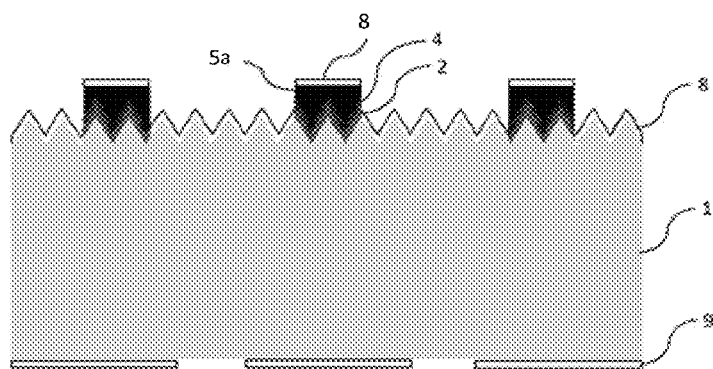
FIG. 20 shows a schematic diagram of a structure after performing grooving on the back passivated anti-reflection film of the P-type silicon substrate.
Figure 21:
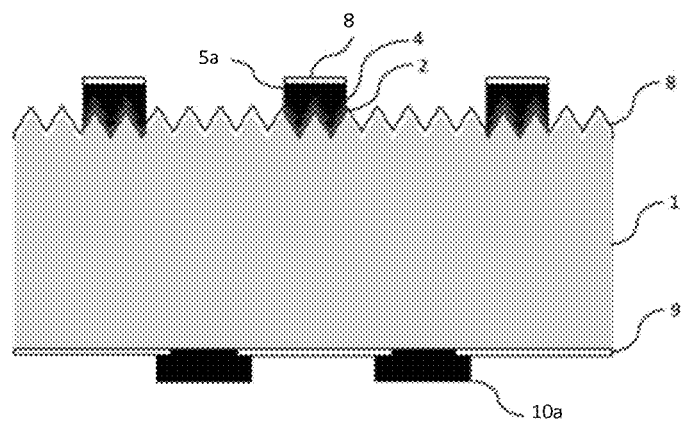
FIG. 21 shows a schematic diagram of a structure of forming a back fine gate electrode in a grooved region.
Figure 22:
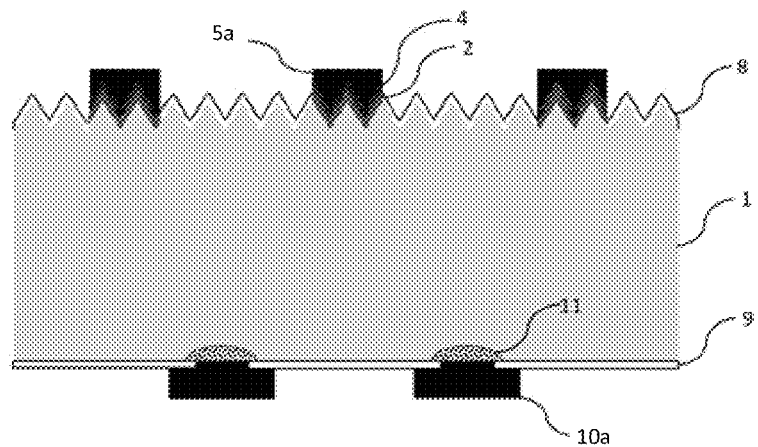
FIG. 22 shows a schematic diagram of a structure after forming a P-type doped silicon layer on the back surface of the P-type silicon substrate.
Figure 25:
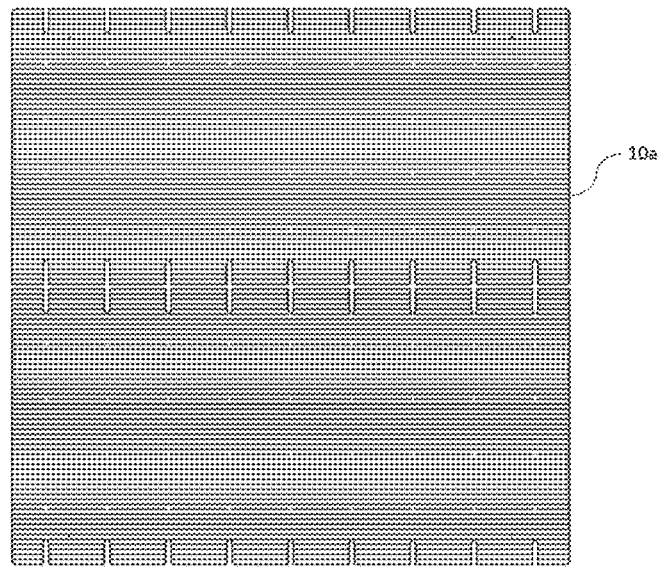
FIG. 25 shows a pattern of the back fine gate electrode.
Figure 26:
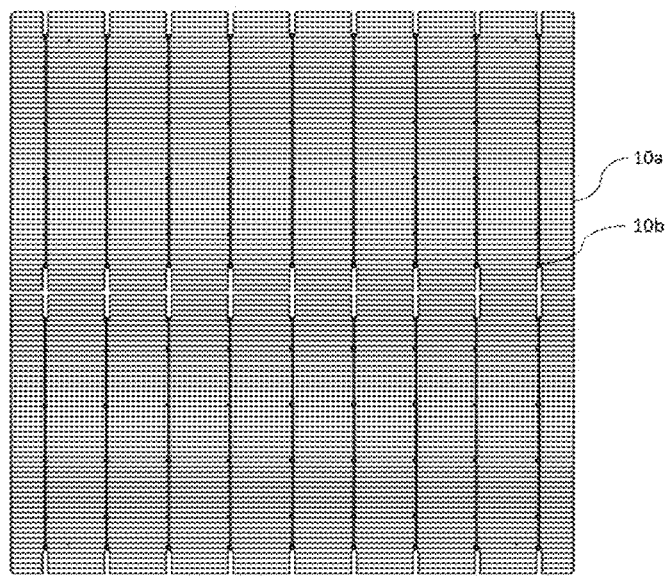
FIG. 26 shows patterns of the back fine gate electrode and a back main gate electrode.

According to the embodiment of the disclosure, as shown in FIG. 19, the preparation method for a solar cell may further comprise a step of preparing the front main gate electrode on the front surface of the P-type silicon substrate 1 and preparing the back metal electrode on the back surface of the P-type silicon substrate 1, and the method specifically comprises:

step 206: forming front passivated anti-reflection films 8 on the front surface of the P-type silicon substrate 1 and the front surface of the front fine gate electrode 5a, and forming a back passivated anti-reflection film 9 on the back surface of the P-type silicon substrate 1;

step 207: performing grooving on the back passivated anti-reflection film, and forming a back fine gate electrode 10a in a grooved region;

step 208: printing a front main gate electrode 5b on the front surface of the front passivated anti-reflection film 8, printing back main gate electrodes 10b on the back surfaces of the back passivated anti-reflection film 9 and the back fine gate electrode 10a, and by means of a sintering process, forming a P-type doped silicon layer 11 in the grooved region, and the front main gate electrode 5b being connected to the front fine gate electrode 5a through the front passivated anti-reflection film 8, the back main gate electrode 10b being electrically connected to the back fine gate electrode 10a, and the back fine gate electrode 10a being in an ohmic contact with the P-type doped silicon layer 11, wherein the back passivated anti-reflection film 9 includes at least one of aluminum oxide, silicon oxide, gallium oxide, silicon nitride, aluminum nitride, and silicon oxynitride. FIG. 25 shows a pattern of the back fine gate electrode, FIG. 26 shows patterns of the back fine gate electrode and a back main gate electrode. Wherein, FIG. 20 shows a schematic diagram of a structure after performing grooving on the back passivated anti-reflection film of the P-type silicon substrate; FIG. 21 shows a schematic diagram of a structure of forming a back fine gate electrode in a grooved region; FIG. 22 shows a schematic diagram of a structure after forming a P-type doped silicon layer on the back surface of the P-type silicon substrate.

The preparation method for a solar cell provided by the embodiment of the disclosure sequentially forms a tunnel silicon oxide layer, an N-type doped polysilicon layer, and a front metal layer in an entire fashion on a front surface of a P-type silicon substrate; then subjects an entire front metal layer to a photoetching process to form a patterned front fine gate electrode; subjects the tunnel silicon oxide layer and the N-type doped polysilicon layer in a region not covered by the front fine gate electrode to chemical etching to form a local tunnel silicon oxide layer and a local N-type doped polysilicon layer, wherein the widths of the local tunnel silicon oxide layer and the local N-type doped polysilicon layer are the same as the width of the front fine gate electrode, thereby achieving an automatic and precise alignment of the front fine gate electrode with a local tunnel oxide passivated layer and a local polysilicon layer during preparation of a metal electrode, and effectively reducing a difficulty in a preparation process of a local passivated contact emitter while ensuring the efficiency of the solar cell.

Meanwhile, the front fine gate electrode is made of a copper metal, which reduces the silver consumption required to prepare the front metal electrode, and effectively reduces the preparation cost of the solar cell.

Another aspect of the disclosure further comprises a solar cell prepared by the above preparation method for a solar cell. The solar cell comprises: a P-type silicon substrate 1, a tunnel silicon oxide layer 2, an N-type doped polysilicon layer 4, and a front fine gate electrode 5a sequentially disposed from bottom to top, wherein
  the widths of the N-type doped polysilicon layer 4 and the front fine gate electrode 5a are both the same as the width of the tunnel silicon oxide layer 2; the front fine gate electrode 5a is in an ohmic contact with the N-type doped polysilicon layer 4.

Further, according to the embodiment of the disclosure, the solar cell further comprises: a front main gate electrode 5b and a front passivated anti-reflection film 8, wherein
  the front passivated anti-reflection film 8 covers the front surfaces of the front fine gate electrode 5b and the P-type silicon substrate 1;
  the front main gate electrode 5b is electrically connected to the front fine gate electrode 5a through the front passivated anti-reflection film 8.

In the disclosure, the aforesaid front fine gate electrode 5a is made of a copper metal; the gate line width of the front fine gate electrode 5a is 2-30 μm.

Further, according to the embodiment of the disclosure, the aforesaid solar cell further comprises: a P-type doped silicon layer 11, a back passivated anti-reflection film 9, a back fine gate electrode 10a, and a back main gate electrode 10b, wherein
  the P-type doped silicon layer 11 is disposed in an internal local region close to the back surface of the P-type silicon substrate 1;
  the back passivated anti-reflection film 9 is disposed on the back surface of the P-type silicon substrate 1;
  the back fine gate electrode 10a penetrates the back passivated anti-reflection film 9 and is in an ohmic contact with the P-type doped silicon layer 11;
  the back main gate electrode 10b is electrically connected to the back fine gate electrode 10a.

The preparation method for a solar cell provided by the disclosure and the solar cell obtained thereby are described in detail below with several specific embodiments.

Embodiment 1

Step A1: Provide a P-type silicon substrate 1, subject the front and back surfaces of the P-type silicon substrate 1 to a texturing process, and subject the back surface of the P-type silicon substrate 1 to a polishing process to obtain the structure as shown in FIG. 4.

Step B1: Form an entire tunnel silicon oxide layer 2 with a thickness of 0.5-2 nm on the front surface and the back surface of the P-type silicon substrate 1, respectively by a high-temperature thermal oxidation method to obtain the structure as shown in FIG. 5.

Step C1: Form an entire intrinsic polysilicon layer 3 on the entire tunnel silicon oxide layers 2 on the front surface and the back surface of the P-type silicon substrate 1, respectively by means of LPCVD/PVD to obtain the structure as shown in FIG. 6.

Step D1: Subject the intrinsic polysilicon layer 3 on the front surface to a doping process with a doping element phosphorus in an ion implantation manner, and perform an annealing process to form an entire N-type doped polysilicon layer 4 on the front surface to obtain the structure as shown in FIG. 7, wherein the thickness of the N-type doped polysilicon layer is 5-200 nm.

Step E1: Directly perform a physical deposition on the entire N-type doped polysilicon layer 4 on the front surface by means of the PVD to generate an entire front metal layer 5 made of a copper material on the front surface to obtain the structure as shown in FIG. 8.

Step F1: Form an entire photoresist layer 6 on the entire front metal layer 5 in an attachment manner to obtain the structure as shown in FIG. 9.

Step G1: Subject the photoresist layer 6 to an exposing process by means of a mask, and remove the unexposed photoresist layer 6 and leave the exposed photoresist layer 7 using a sodium carbonate solution to obtain the structure as shown in FIG. 11.

Step H1: Remove the front metal layer 5 not covered by the exposed photoresist layer 7 using a mixture of a sulfuric acid and hydrogen peroxide to form a front fine gate electrode 5a to obtain the structure as shown in FIG. 12, wherein the gate line width of the front fine gate electrode 5a is 2-30 μm.

Step I1: Remove the exposed photoresist layer 7 using a sodium hydroxide solution to obtain the structure as shown in FIG. 13.

Step J1: Remove the N-type doped polysilicon layer 4 in the region not covered by the front fine gate electrode 5a and the intrinsic polysilicon layer 3 on the back surface of the P-type silicon structure using an alkali solution, e.g., using a KOH solution in which the volume ratio of KOH to deionized water is 3:11, to obtain the structure as shown in FIG. 14.

Step K1: Remove the tunnel silicon oxide layer 2 in the region not covered by the front fine gate electrode 5a and the tunnel silicon oxide layer 2 on the back surface of the P-type silicon substrate using an acid solution, e.g., using an HF solution in which the volume ratio of HF to deionized water is 2:3, to obtain the structure as shown in FIG. 15.

Embodiment 2

Step A2: the same as the step A1 provided in Embodiment 1.

Step B2: Form an entire tunnel silicon oxide layer 2 with a thickness of 0.5-2 nm on the front surface and the back surface of the P-type silicon substrate 1, respectively by a nitric acid oxidation method, as shown in FIG. 5.

Step C2: Form an entire intrinsic polysilicon layer 3 on the entire tunnel silicon oxide layers 2 on the front surface and the back surface of the P-type silicon substrate 1 by means of the PVD, respectively, as shown in FIG. 6.

Step D2: Subject the intrinsic polysilicon layer 3 on the front surface to a doping process with a doping element phosphorus in an ion implantation manner, and perform an annealing process to form the entire N-type doped polysilicon layer 4, as shown in FIG. 7.

Step E2: Directly perform a physical deposition on the entire N-type doped polysilicon layer 4 by means of the PVD to generate an entire front metal layer 5 made of a copper material to obtain the structure as shown in FIG. 8.

Step F2: Form an entire photoresist layer 6 on the entire front metal layer 5 in an attachment manner, as shown in FIG. 9.

Step G2: Subject the photoresist layer 6 to an exposing process by means of a mask, and remove the unexposed photoresist layer 6 and leave the exposed photoresist layer 7 using a potassium carbonate solution to obtain the structure as shown in FIG. 11.

Step H2: Remove the front metal layer 5 not covered by the exposed photoresist layer 7 using a mixture of a sulfuric acid and hydrogen peroxide to form a front fine gate electrode 5a to obtain the structure as shown in FIG. 12.

Step I2: Remove the exposed photoresist layer 7 using a potassium hydroxide solution to obtain the structure as shown in FIG. 13.

Step J2: Remove the N-type doped polysilicon layer 4 in the region not covered by the front fine gate electrode 5a and the intrinsic polysilicon layer 3 on the back surface of the P-type silicon structure using a sodium hydroxide solution to obtain the structure as shown in FIG. 14.

Step K2: Remove the tunnel silicon oxide layer 2 in the region not covered by the front fine gate electrode 5a and the tunnel silicon oxide layer 2 on the back surface of the P-type silicon substrate using an HF solution to obtain the structure as shown in FIG. 15.

Step L2: Form a front passivated anti-reflection film 8 on the front surface of the P-type silicon substrate 1, and form a back passivated anti-reflection film 9 on the back surface of the P-type silicon substrate 1 to obtain the structure as shown in FIG. 20, wherein the front passivated anti-reflection film and the back passivated anti-reflection film are both at least one of aluminum oxide, silicon oxide, gallium oxide, silicon nitride, aluminum nitride, and silicon oxynitride.

Step M2: Perform grooving on the back passivated anti-reflection film 9, and form a back fine gate electrode 10a in a grooved region to obtain the structure as shown in FIG. 21.

Step N2: Prepare a front main gate electrode 5b and a back main gate electrode 10b by printing a silver paste, so that the front main gate electrode 5b is electrically connected to the front fine gate electrode 5a; the back main gate electrode 10b is electrically connected to the back fine gate electrode 10a.

Step O2: Form a P-type doped silicon layer 11 in an internal region corresponding to the grooved region on the back surface of the P-type silicon substrate 1 by means of a sintering process, so that the back fine gate electrode 10a is in an ohmic contact with the P-type doped silicon layer 11 to obtain the structure as shown in FIG. 22.

Embodiment 3

The respective steps in this embodiment are the same as those in Embodiment 2, except that in step E3, an entire front metal layer 5 is generated on an entire N-type doped polysilicon layer 4 in a manner of combining the PVD with an electroplating method, that is, after a seed layer is formed on the entire N-type doped polysilicon layer 4 by means of the PVD, the P-type silicon substrate 1 having its front surface formed with the tunnel silicon oxide layer 2 and the N-type doped polysilicon layer 4 is immersed into an electroplating solution containing copper ions to form the front metal layer 5 made of a copper material.

Embodiment 4

The respective steps in this embodiment are the same as those in Embodiment 2, except that in step E4, an entire front metal layer 5 is generated on an entire N-type doped polysilicon layer 4 by a method of combining the PVD with light-induced deposition, that is, after a seed layer is formed on the entire N-type doped polysilicon layer 4 by means of the PVD technology, a laser is used as an induced light source to deposit the front metal layer 5 made of a copper material on the entire N-type doped polysilicon layer 4.

Embodiment 5

The respective steps in this embodiment are the same as those in Embodiment 2, except that in step M5, after grooving is performed on the back passivated anti-reflection film 9, the grooved region is covered using a linear aluminum paste to form the back fine gate electrode.

Embodiment 6

The respective steps in this embodiment are the same as those in Embodiment 2, except that in step M6, after grooving is performed on the back passivated anti-reflection film 9, the grooved region is covered using a silver aluminum paste to form the back fine gate electrode.

The introductions provided by the above steps are only used to help understanding of the method, structure and main idea of the disclosure. Those skilled in the art may also make several improvements and modifications to the disclosure without departing from the principle of the disclosure, and these improvements and modifications also fall within the scopes of protection of the claims of the disclosure.

What is claimed is:

1. A method for preparing a solar cell, which comprises:
   step 101: sequentially forming a tunnel silicon oxide layer, an N-type doped polysilicon layer, and a front metal layer in an entire fashion on a front surface of a P-type silicon substrate;
   step 102: subjecting an entire front metal layer to a photoetching process to form a patterned front fine gate electrode,
   wherein the step 102 further comprises:
      step 2-1: forming a photoresist layer on the front metal layer;
      step 2-2: subjecting the photoresist layer to an exposing process by means of a mask, the photoresist layer in an exposed region forming an exposed photoresist layer, and the photoresist layer in an unexposed region being removed using a first solution to expose the front metal layer;
      step 2-3: removing the exposed front metal layer using a second solution, the front metal layer covered by the exposed photoresist layer forming the patterned front fine gate electrode; and
      step 2-4: removing the exposed photoresist layer using a film stripping solution; and
      step 103: subjecting the tunnel silicon oxide layer and the N-type doped polysilicon layer in a region not covered by the front fine gate electrode to chemical etching to form a local tunnel silicon oxide layer and a local N-type doped polysilicon layer,
      wherein the width of the local tunnel silicon oxide layer and the width the local N-type doped polysilicon layer are the same as the width of the front fine gate electrode.

2. The method of claim 1, wherein before the step 101, the method further comprises:
   subjecting the front surface of the P-type silicon substrate to a texturing process.

3. The method of claim 1, wherein the step 101 comprises:
   step 1-1: forming an entire tunnel silicon oxide layer on the front surface of the P-type silicon substrate;
   step 1-2: forming an entire intrinsic polysilicon layer on the tunnel silicon oxide layer;
   step 1-3: subjecting the intrinsic polysilicon layer to N-type doping to form an entire N-type doped polysilicon layer; and
   step 1-4: forming the entire front metal layer on the entire N-type doped polysilicon layer.

4. The method of claim 3, wherein the method further comprises:
   step 104: forming front passivated anti-reflection films on the front surface of the P-type silicon substrate and the front surface of the front fine gate electrode; and
   step 105: printing a front main gate electrode on the front surface of the front passivated anti-reflection film, and after sintering, connecting the front main gate electrode to the front fine gate electrode through the front passivated anti-reflection film.

5. A method for preparing a solar cell, which comprises:
   step 201: sequentially forming a tunnel silicon oxide layer and an intrinsic polysilicon layer in an entire fashion on a front surface and a back surface of a P-type silicon substrate, respectively;
   step 202: subjecting the intrinsic polysilicon layer on the front surface to N-type doping to form an entire N-type doped polysilicon layer;
   step 203: forming an entire front metal layer on the N-type doped polysilicon layer;
   step 204: subjecting the entire front metal layer to a photoetching process to form a patterned front fine gate electrode;
   step 205: subjecting the tunnel silicon oxide layer and the N-type doped polysilicon layer in a region not covered by the front fine gate electrode on the front surface and the tunnel silicon oxide layer and the intrinsic polysilicon layer on the back surface to chemical etching to form a local tunnel silicon oxide layer and a local N-type doped polysilicon layer on the front surface, and to remove the tunnel silicon oxide layer and the intrinsic polysilicon layer on the back surface;
   step 206: forming front passivated anti-reflection films on the front surface of the P-type silicon substrate and the front surface of the front fine gate electrode, and forming a back passivated anti-reflection film on the back surface of the P-type silicon substrate;
   step 207: performing grooving on the back passivated anti-reflection film, and forming a back fine gate electrode in a grooved region; and
   step 208: printing a front main gate electrode on the front surface of the front passivated anti-reflection film, printing back main gate electrodes on the back surfaces of the back passivated anti-reflection film and the back fine gate electrode, and by means of a sintering process, forming a P-type doped silicon layer in the grooved region, and the front main gate electrode being connected to the front fine gate electrode through the front passivated anti-reflection film, the back main gate electrode being electrically connected to the back fine gate electrode, the back fine gate electrode being in an ohmic contact with the P-type doped silicon layer.

6. The method of claim 5, wherein before the step 201, the method further comprises:
   subjecting the front surface and the back surface of the P-type silicon substrate to a texturing process, respectively, and then subjecting the back surface to a polishing process.

7. The method of claim 5, wherein the step 204 comprises:
   step 4-1: forming a photoresist layer on the front metal layer;
   step 4-2: subjecting the photoresist layer to an exposing process by means of a mask, the photoresist layer in an exposed region forming an exposed photoresist layer, and the photoresist layer in an unexposed region being removed using a first solution to expose the front metal layer;
   step 4-3: removing the exposed front metal layer using a second solution, the front metal layer covered by the exposed photoresist layer forming the front fine gate electrode; and
   step 4-4: removing the exposed photoresist layer using a film stripping solution.

8. A method for preparing a solar cell, which comprises:
   step 101: sequentially forming an entire tunnel silicon oxide layer, an N-type doped polysilicon layer, and a front metal layer in an entire fashion on a front surface of a P-type silicon substrate,
   wherein the step 101 further comprises:
      step 1-1: forming the entire tunnel silicon oxide layer on the front surface of the P-type silicon substrate;
      step 1-2: forming an entire intrinsic polysilicon layer on the tunnel silicon oxide layer;

step 1-3: subjecting the intrinsic polysilicon layer to N-type doping to form an entire N-type doped polysilicon layer; and step 1-4: forming the entire front metal layer on the entire N-type doped polysilicon layer;

step 102: subjecting the entire front metal layer to a photoetching process to form a patterned front fine gate electrode;

step 103: subjecting the tunnel silicon oxide layer and the N-type doped polysilicon layer in a region not covered by the front fine gate electrode to chemical etching to form a local tunnel silicon oxide layer and a local N-type doped polysilicon layer, wherein the width of the local tunnel silicon oxide layer and the width the local N-type doped polysilicon layer are the same as the width of the front fine gate electrode;

step 104: forming front passivated anti-reflection films on the front surface of the P-type silicon substrate and the front surface of the front fine gate electrode; and step 105: printing a front main gate electrode on the front surface of the front passivated anti-reflection film, and after sintering, connecting the front main gate electrode to the front fine gate electrode through the front passivated anti-reflection film.

9. A method for preparing a solar cell, which comprises:

step 201: sequentially forming a tunnel silicon oxide layer and an intrinsic polysilicon layer in an entire fashion on a front surface and a back surface of a P-type silicon substrate, respectively;

step 202: subjecting the intrinsic polysilicon layer on the front surface to N-type doping to form an entire N-type doped polysilicon layer;

step 203: forming an entire front metal layer on the N-type doped polysilicon layer;

step 204: subjecting the entire front metal layer to a photoetching process to form a patterned front fine gate electrode, wherein the step 204 further comprises:

step 4-1: forming a photoresist layer on the front metal layer;

step 4-2: subjecting the photoresist layer to an exposing process by means of a mask, the photoresist layer in an exposed region forming an exposed photoresist layer, and the photoresist layer in an unexposed region being removed using a first solution to expose the front metal layer;

step 4-3: removing the exposed front metal layer using a second solution, the front metal layer covered by the exposed photoresist layer forming the patterned front fine gate electrode; and step 4-4: removing the exposed photoresist layer using a film stripping solution;

step 205: subjecting the tunnel silicon oxide layer and the N-type doped polysilicon layer in a region not covered by the patterned front fine gate electrode on the front surface and the tunnel silicon oxide layer and the intrinsic polysilicon layer on the back surface to chemical etching to form a local tunnel silicon oxide layer and a local N-type doped polysilicon layer on the front surface, and to remove the tunnel silicon oxide layer and the intrinsic polysilicon layer on the back surface.

\* \* \* \* \*